(12) United States Patent
Liepold et al.

(10) Patent No.: US 9,076,933 B2
(45) Date of Patent: Jul. 7, 2015

(54) CERAMIC CONVERSION ELEMENT, SEMICONDUCTOR CHIP COMPRISING A CERAMIC CONVERSION ELEMENT AND METHOD FOR PRODUCING A CERAMIC CONVERSION ELEMENT

(75) Inventors: Ute Liepold, Munich (DE); Dominik Eisert, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/981,370

(22) PCT Filed: Jan. 17, 2012

(86) PCT No.: PCT/EP2012/050624
§ 371 (c)(1),
(2), (4) Date: Aug. 20, 2013

(87) PCT Pub. No.: WO2012/104141
PCT Pub. Date: Aug. 9, 2012

(65) Prior Publication Data
US 2013/0320384 A1 Dec. 5, 2013

(30) Foreign Application Priority Data

Feb. 2, 2011 (DE) .......................... 10 2011 010 118

(51) Int. Cl.
*H01L 33/50* (2010.01)
*B32B 18/00* (2006.01)
(Continued)

(52) U.S. Cl.
CPC .............. *H01L 33/504* (2013.01); *B32B 18/00* (2013.01); *C04B 2237/34* (2013.01); *C04B 2237/341* (2013.01); *C04B 2237/343* (2013.01);
(Continued)

(58) Field of Classification Search
CPC .............................. H01L 33/504; B32B 18/00
USPC ........................... 156/89.12; 257/98; 362/317
See application file for complete search history.

(56) References Cited

U.S. PATENT DOCUMENTS 6,825,054 B2 * 11/2004 Valentine et al. ................ 438/22
2004/0115352 A1 * 6/2004 Schultheis et al. ............. 427/282
(Continued)

FOREIGN PATENT DOCUMENTS

DE      10 2005 030 128 A1      3/2006
DE      10 2006 037 730 A1      2/2008
(Continued)

OTHER PUBLICATIONS

English translation of Korean Official Action dated Aug. 29, 2014 from corresponding Korean Patent Application No. 10-2013-7020233.
(Continued)

*Primary Examiner* — Daniel Shook
(74) *Attorney, Agent, or Firm* — DLA Piper LLP (US)

(57) ABSTRACT

A ceramic conversion element includes an active ceramic layer that converts electromagnetic radiation in a first wavelength range into electromagnetic radiation in a second wavelength range, which is different from the first wavelength range, and a carrier layer transmissive to radiation in the first wavelength range and/or radiation in the second wavelength range, wherein an inhibitor layer is arranged between the active layer and the carrier layer, the inhibitor layer reducing diffusion of activator ions from the active layer into the carrier layer.

12 Claims, 5 Drawing Sheets

(51) Int. Cl.
*C09K 11/77* (2006.01)
*F21V 9/00* (2015.01)

(52) U.S. Cl.
CPC ....... C04B2237/36 (2013.01); C04B 2237/366 (2013.01); C04B 2237/368 (2013.01); C04B 2237/704 (2013.01); *C09K 11/7774* (2013.01); *F21V 9/00* (2013.01)

(56) References Cited

U.S. PATENT DOCUMENTS

| | | | |
|---|---|---|---|
| 2005/0269582 | A1 | 12/2005 | Mueller et al. |
| 2007/0170447 | A1* | 7/2007 | Negley et al. .................. 257/98 |
| 2008/0116467 | A1 | 5/2008 | Mueller et al. |
| 2010/0276717 | A1 | 11/2010 | Boerkekamp et al. |
| 2010/0289044 | A1 | 11/2010 | Krames et al. |
| 2012/0068213 | A1* | 3/2012 | Zhang et al. .................. 257/98 |
| 2012/0074448 | A1 | 3/2012 | Wierer, Jr. et al. |

FOREIGN PATENT DOCUMENTS

| | | | |
|---|---|---|---|
| DE | 10 2008 054 029 A1 | 5/2010 | |
| JP | 2004-535348 | 11/2004 | |
| JP | 2008-533270 | 8/2008 | |
| JP | 2013-518797 | 5/2013 | |
| JP | 2013-543525 | 12/2013 | |
| KR | 2010052504 | 5/2010 | |
| WO | 02/09028 | 11/2002 | |
| WO | 2010/010484 A1 | 1/2010 | |
| WO | WO-2010010484 A1 * | 1/2010 | ............. H01L 33/00 |
| WO | 2011/097137 A1 | 8/2011 | |

OTHER PUBLICATIONS

English translation of Japanese Notification of Reasons for Refusal dispatched Jul. 14, 2014 from corresponding Japanese Application No. 2013-552147.

Chen Jinxin ,"Organic Electroluminescent Materials and Devices", Jun. 1, 2007,with one page of English translation.

* cited by examiner

CERAMIC CONVERSION ELEMENT, SEMICONDUCTOR CHIP COMPRISING A CERAMIC CONVERSION ELEMENT AND METHOD FOR PRODUCING A CERAMIC CONVERSION ELEMENT

TECHNICAL FIELD

This disclosure relates to a ceramic conversion element, a semiconductor chip comprising a ceramic conversion element and a method of producing a ceramic conversion element.

BACKGROUND

It could be helpful to provide a ceramic conversion element which is easy and simple to handle and to provide a method of producing such a ceramic conversion element. It could further be helpful to provide a semiconductor chip that emits white mixed-colored light in the warm-white range.

SUMMARY

We provide a ceramic conversion element including an active ceramic layer that converts electromagnetic radiation in a first wavelength range into electromagnetic radiation in a second wavelength range, which is different from the first wavelength range, and a carrier layer transmissive to radiation in the first wavelength range and/or radiation in the second wavelength range, wherein an inhibitor layer is arranged between the active layer and the carrier layer, the inhibitor layer reducing diffusion of activator ions from the active layer into the carrier layer.

We also provide a radiation-emitting semiconductor chip including a semiconductor body that emits electromagnetic radiation in a first wavelength range from a radiation exit area, and the ceramic conversion element including an active ceramic layer that converts radiation in the first wavelength range into radiation in a second wavelength range, which is different from the first wavelength range.

We further provide a method of producing a ceramic conversion element including providing a carrier layer or a green sheet as a basis for a carrier layer, applying a green sheet as a basis for an active ceramic layer or applying a powder dispersion as a basis for the active ceramic layer on to the carrier layer or on to the green sheet serving as a basis for the carrier layer, and sintering the layer composite assembly.

DETAILED DESCRIPTION

Figure 1:
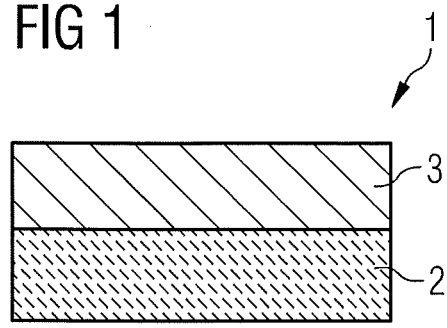
FIGS. 1 to 4 in each case show an example of a schematic sectional illustration of a ceramic conversion element.

We provided a ceramic conversion element comprising in particular:
- an active ceramic layer that converts electromagnetic radiation in a first wavelength range into electromagnetic radiation in a second wavelength range, which is different from the first wavelength range, and
- a carrier layer transmissive to electromagnetic radiation in the first wavelength range and/or electromagnetic radiation in the second wavelength range.

If the conversion element is provided to emit mixed light, for example, having a white color which comprises converted and unconverted radiation, then the carrier layer preferably transmits at least 75%, particularly preferably at least 90% percent, of the radiation in the first and in the second wavelength range.

If the conversion element is provided to convert radiation in the first wavelength range as fully as possible into radiation in the second wavelength range, then the carrier layer preferably transmits at least 75%, particularly preferably at least 90%, of the radiation in the second wavelength range and preferably absorbs radiation in the first wavelength range such that a maximum of 10% of the radiation can penetrate through the conversion element. In this instance, the carrier layer is particularly preferably arranged toward the coupling-out side of the semiconductor chip.

The carrier layer is provided to mechanically stabilize the active ceramic layer. By using the carrier layer, it is advantageously possible to use active ceramic layers for wavelength conversion which themselves are not self-supporting. It is therefore possible for the active ceramic layer to be fashioned so thin that a higher activator concentration can be used and a wider range of a color locus to be obtained in combination with a predefined semiconductor body can thus be achieved.

It is therefore possible to set the conversion effect of the conversion element with the aid of the thickness of the active ceramic layer, wherein arbitrarily thin active layers can be realized and a wide color locus range in combination with a predefined semiconductor body can thus be achieved. One particular advantage is that the conversion effect is not set by way of the activator content in the phosphor, but rather by way of the thickness of the active ceramic layer. Therefore, it is possible to use phosphors having comparatively high activator concentrations such as are used, for example, in conversion laminae, the phosphors of which are introduced in particle form into a silicone matrix. In this way, it is possible to avoid undesirable variations in the phosphor light color often caused by changes in the activator concentration. An increase in efficiency and a more homogeneous color distribution of the conversion element are generally furthermore possible by a thin active ceramic layer.

The conversion element may comprise a single active layer and a single carrier layer. The conversion element can also be formed from a single active ceramic layer and a single carrier layer.

Furthermore, it is also possible for the conversion element to comprise a plurality of active layers and a plurality of carrier layer. These are preferably arranged alternately.

The conversion element may be formed from an active layer which is in each case encapsulated by a further carrier layer, that is to say that a respective carrier layer may be applied on each main side of the active layer. In this case, the active ceramic layer preferably forms in each case a common interface with the respective carrier layer. The encapsulation of the active layer between two generally inert carrier layers can advantageously increase the lifetime of the ceramic conversion element.

The active ceramic layer can, for example, comprise one of the following phosphors or be formed from one of the following phosphors: garnets doped with rare earth metals, alkaline earth metal sulfides doped with rare earth metals, thiogallates doped with rare earth metals, aluminates doped with rare earth metals, silicates such as orthosilicates, doped with rare earth metals, chlorosilicates doped with rare earth metals, alkaline earth metal silicon nitrides doped with rare earth metals, oxynitrides doped with rare earth metals and aluminum oxynitrides doped with rare earth metals, silicon nitrides doped with rare earth metals, sialons.

In particular, garnets such as yttrium aluminum oxide (YAG), lutetium aluminum oxide (LuAG) and terbium aluminum oxide (TAG), can be used as phosphors.

The phosphors are doped, for example, with one of the following activators: cerium, europium, terbium, praseodymium, samarium, manganese.

The active layer may have a thickness which is less than or equal to 100 μm, preferably less than or equal to 50 μm, particularly preferably less than or equal to 25 μm.

The ceramic active layer may comprise a phosphor, the activator of which has a concentration of 2% to 5%. Particularly preferably, YAG:Ce is used as phosphor.

The product of the thickness of the ceramic layer and the activator concentration may be approximately constant. Particularly preferably, the product of the thickness of the ceramic layer and the activator concentration in percent may be approximately 50 $\mu m^{-1}$. Particularly preferably, YAG:Ce is used as phosphor.

The carrier layer like the active layer may be formed from a ceramic material. The material for a ceramic carrier layer should expediently be selected such that it reacts chemically only slightly with the phosphor of the active layer at the sintering temperatures required for producing the conversion element. By way of example, one of the above mentioned materials for the phosphors is suitable as a material for the ceramic carrier layer, but it does not have an activator. Particularly preferably, the ceramic carrier layer is formed from undoped phosphor material without an activator which is used in activator-doped form for the active layer. Furthermore, a substance related to or compatible with the phosphor used can also be used for the carrier layer.

Particularly preferably, the carrier layer is substantially free of activator ions of the phosphors. In other words, the carrier layer preferably has no or only negligible wavelength-converting properties. Particularly preferably, the activator concentration averaged over the total volume of the carrier layer is a maximum of ¼ of the activator concentration in the active ceramic layer.

Particularly preferably, a garnet phosphor such as $Y_3Al_5O_{12}$:Ce(YAG:Ce), for example, is used as material for the active ceramic layer. Consequently, a conversion element comprising an active ceramic layer formed from YAG:Ce preferably comprises a carrier layer formed from undoped YAG without an activator.

Furthermore, aluminum oxide is also suitable as a material for the carrier layer. Aluminum oxide is, in particular, a substance related to or compatible with YAG:Ce.

The ceramic conversion element may have a thickness of 50 μm to 200 μm, preferably 80 μm to 200 μm.

The ceramic conversion element may have a thickness of 50 μm to 180 μm, preferably 80 μm to 180 μm.

Such a ceramic conversion element can advantageously be handled in a particularly simple manner.

An inhibitor layer may be arranged between the active layer and the carrier layer, the inhibitor layer being suitable for at least reducing the diffusion of activator ions from the active ceramic layer into the carrier layer.

Particularly preferably, the inhibitor layer is made very thin. The inhibitor layer may have a thickness of less than or equal to 5 μm.

Particularly, preferably, the inhibitor layer is formed from a ceramic material.

The inhibitor layer can, for example, be formed from aluminum oxide or contain aluminum oxide. Aluminum oxide can be suitable in particular to at least reduce the diffusion of cerium from an active ceramic layer containing YAG:Ce into an undoped YAG carrier layer.

The carrier layer may have scattering centers suitable for scattering electromagnetic radiation in the first wavelength range and/or in the second wavelength range. By way of example, pores or particles within the ceramic carrier layer are provided as scattering centers. The scattering centers preferably have a diameter of 1.5 μm to 0.5 μm. Particularly preferably, the scattering centers have a refractive index which deviates by at least 0.1 from the refractive index of the material of the carrier layer. As scattering centers it is possible to use, for example, particles which comprise a ceramic material or are formed from a ceramic material, wherein the ceramic material of the scattering centers is different from the ceramic material of the carrier layer. Preferably, the particles comprise one of the following materials or consist of one of the following materials: aluminum oxide, silicon oxide, titanium oxide. Such particles are suitable, in particular, for use in conjunction with a carrier layer formed from undoped YAG. The homogeneity of the emission characteristic of the conversion element can be improved by the targeted incorporation of scattering centers into the carrier layer. Furthermore, a neutral color impression of the conversion element in the inactive state can be obtained by the scattering centers.

The carrier layer may comprise at least one pigment that imparts a specific coloration to the converter element. A specific color impression of the converter element can advantageously be obtained as a result.

The ceramic conversion element is preferably suitable to at least partly convert the radiation of a semiconductor body into radiation in a different wavelength range.

A radiation-emitting semiconductor chip comprises, in particular:
a semiconductor body that emits electromagnetic radiation in a first wavelength range from a radiation exit area, and
a ceramic conversion element as already described.

Particularly preferably, the ceramic conversion element converts only part of the radiation of the semiconductor body into radiation in the second wavelength range and transmits a further part of the radiation emitted by the semiconductor body. Mixed-colored, for example, white light can be generated in this way.

Particularly preferably, the semiconductor body emits light from the blue spectral range. Particularly preferably, the ceramic conversion element converts part of the blue light of the semiconductor body into light from the yellow spectral range. Mixed-colored, white light can be generated in this way. A wavelength-converting active ceramic layer that converts blue light into yellow light preferably comprises YAG:Ce as a phosphor.

The semiconductor body may emit radiation from the ultraviolet spectral range, preferably 380 nm to 420 nm. The ultraviolet light of the semiconductor body is preferably converted into visible light by the ceramic conversion element. Particularly preferably, the ceramic conversion element in this case converts the radiation of the ceramic body as fully as possible into radiation in a second wavelength range. To generate white light, the conversion element in this case generally comprises at least two different phosphors, for example, a phosphor which converts ultraviolet radiation into blue radiation and, a further phosphor, which converts ultraviolet radiation into yellow radiation. Phosphors doped with europium as activator are preferably used for the conversion of ultraviolet light.

The ceramic conversion element is preferably arranged such that a large part of the radiation emitted by the semiconductor body can pass through the conversion element.

Particularly preferably, the active layer of the conversion element is applied in direct contact on to the radiation exit area of the semiconductor body. In this way, heat which arises during operation in the active ceramic layer on account of the Stokes shift can be dissipated via the semiconductor body.

The carrier layer may face away from the radiation exit area of the semiconductor body. It is thus advantageously possible for a carrier layer of the conversion element provided with scattering centers and/or pigments to influence the color impression for an external observer.

Particularly preferably, the radiation-emitting semiconductor chip emits mixed-colored, white light having a color temperature of 4000 K to 6000 K on the Planck curve.

The semiconductor chip may comprise a semiconductor body which emits radiation from the blue spectral range, and also a ceramic conversion element comprising an active ceramic layer based on a YAG:Ce phosphor. In this case, parts of the yttrium of the YAG:Ce ceramic can be replaced by gadolinium. As a result of the replacement of yttrium by gadolinium within the host lattice, the lattice constant of the host lattice changes, as a result of which the emission wavelength of the activator experiences a shift toward longer wavelengths. In this way, it is advantageously possible to provide a semiconductor chip which emits white light having a color locus below the Planck curve.

A method of producing a ceramic conversion element comprises the following steps:
  providing a carrier layer or a green sheet as a basis for a carrier layer,
  applying a green sheet as a basis for an active ceramic layer or applying a powder dispersion as a basis for the active ceramic layer on to the carrier layer or on to the green sheet serving as a basis for the carrier layer, and
  sintering the layer composite assembly.

If the active ceramic layer and the carrier layer are intended to be formed in each case from a ceramic, then a corresponding green sheet is preferably made available as a basis for the carrier layer. On to the latter, then either a further green sheet as a basis for an active ceramic layer can be laminated or a corresponding powder dispersion as a basis for the active ceramic layer can be applied on to the green sheet.

The powder dispersion can be applied, for example, by spraying or sedimentation.

By laminating corresponding green sheets, it is possible to obtain an arbitrary layer composite assembly composed of ceramic carrier layers and active ceramic layers. During lamination, two or more green sheets are joined to one another by being subjected to pressure and, if appropriate, temperature.

To provide an arbitrarily thick ceramic carrier layer, it is also possible for a plurality of green sheets of identical type as a basis for a carrier layer to be laminated one above another.

The inhibitor layer, too, can be produced on the basis of a green sheet and laminated into the layer stack.

In particular, for the purpose of producing particularly thin ceramic layers such as, for example, a ceramic inhibitor layer or a ceramic active layer, the coating of a corresponding carrier material by spraying or sedimentation is possible.

Further advantageous will become apparent from the examples described below in conjunction with the figures.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size to enable better illustration and/or to afford a better understanding.

The ceramic conversion element 1 in accordance with the example in FIG. 1 comprises an active ceramic layer 2 that converts radiation in a first wavelength range into radiation in a second wavelength range. For this purpose, the active ceramic layer 2 is formed from a sintered phosphor. The phosphor can be YAG:Ce, for example. The thickness of the active ceramic layer 2 is preferably significantly less than 100 µm, particularly preferably less than 50 µm, approximately 25 µm. With the use of such a comparatively thin active ceramic layer 2, it is advantageously possible to use YAG:Ce having a high activator concentration as phosphor such as is also used in a conversion lamina in which phosphor particles are embedded in a resin.

Particularly preferably, the product of the thickness of the active ceramic layer 2 and the activator concentration in percent is approximately 50 µm$^{-1}$. That means that the activator concentration for a thickness of the ceramic layer 2 of approximately 25 µm has a value of approximately 2%.

Furthermore, the ceramic conversion element 1 comprises a carrier layer 3 transmissive to radiation in the first and/or in the second wavelength range. The carrier layer 3 and the active ceramic wavelength-converting layer 2 are applied in direct contact on one another and therefore form a common interface. The carrier layer 3 can be formed from an undoped ceramic YAG material, for example. Furthermore, aluminum oxide, for example, is also suitable as material for the carrier layer 3.

The carrier layer 3 is provided to mechanically stabilize the thin active ceramic layer 2. The carrier layer 3 increases the thickness of the entire ceramic conversion element 1 such that the latter preferably has a thickness of 80 to 180 µm.

Figure 2:
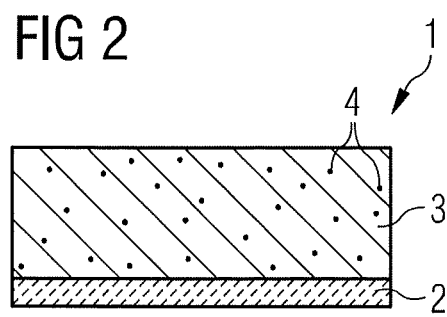

In contrast to the ceramic conversion element 1 in FIG. 1, the ceramic conversion element 1 in accordance with the example in FIG. 2 has scattering centers 4 within the carrier layer 3. By way of example, pores or particles comprising a different material than the material of the carrier layer 3 can serve as scattering centers 4. In this example, the scattering centers 4 predominantly have a diameter of approximately 1 µm. The emission homogeneity of the ceramic conversion element 1 can be improved by the targeted incorporation of scattering centers 4 in the carrier layer 3. Furthermore, the carrier layer 3 can comprise pigments that impart a desired coloration to the carrier layer.

Figure 3:
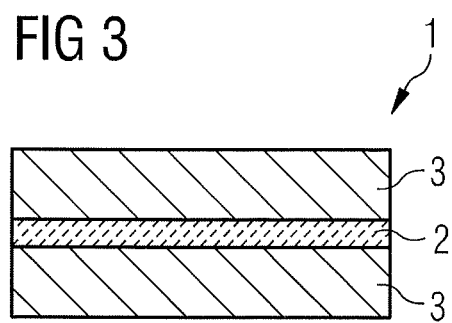

The ceramic conversion element 1 in accordance with the example in FIG. 3 comprises an active ceramic layer 2 encapsulated by two carrier layers 3. In this case, respectively on a main side of the active ceramic layer 2, a carrier layer 3 is arranged in direct contact with the respective main side. The lifetime of the ceramic element can be increased by the encapsulation of the active ceramic layer 2.

Figure 4:
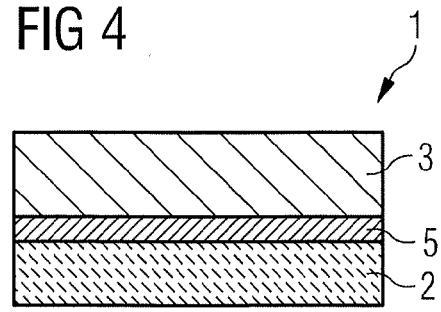

In contrast to the conversion elements 1 in accordance with FIGS. 1 to 3, the ceramic conversion element 1 in accordance with the example in FIG. 4 comprises an inhibitor layer 5. In this case, the inhibitor layer 5 is arranged between the active ceramic layer 2 and the radiation-transmissive carrier layer 3.

The inhibitor layer 5 is provided to inhibit diffusion of activator ions from the active ceramic layer 2 into the carrier layer 3. The inhibitor layer 5 is preferably made very thin and has a thickness of less than or equal to 5 µm. A suitable material for the inhibitor layer 5 is aluminum oxide, for example.

Figure 5:
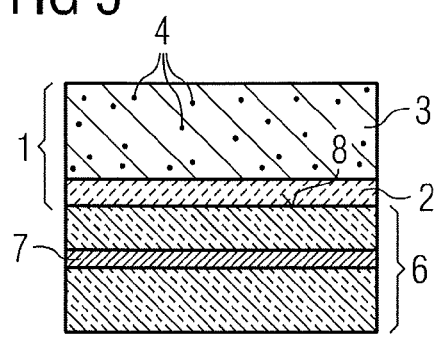
FIG. 5 shows a schematic sectional illustration of an example of a semiconductor chip.

The semiconductor chip in accordance with the example in FIG. 5 comprises a semiconductor body 6 having a radiation-generating zone 7. The radiation-generating zone 7 of the semiconductor body 6 generates radiation in a first wavelength range during operation, the radiation being emitted from the radiation exit area 8 of the semiconductor body 6. Particularly preferably, the first wavelength range comprises radiation from the blue spectral range.

Furthermore, the semiconductor chip in accordance with FIG. 5 comprises a ceramic conversion element 1 as described, for example, in FIG. 2. Furthermore, it is also possible for the semiconductor body 6 in accordance with FIG. 5 to be combined with a different conversion element 1 such as has been described, for example, with reference to FIGS. 1, 3 and 4, to form a semiconductor chip.

The ceramic conversion element 1 is applied with the active wavelength-converting layer 2 in direct contact on to the radiation exit area 8 of the semiconductor body 6. As a result, heat that arises on account of the Stokes shift within the active layer 2 of the conversion element 1 can be dissipated via the semiconductor body 6, for example, to an electrical contact fitted on the rear side. The scattering centers 4 within the carrier layer 3 in this case preferably lead to a neutral, for example, white, color impression for an external observer.

Figure 6:
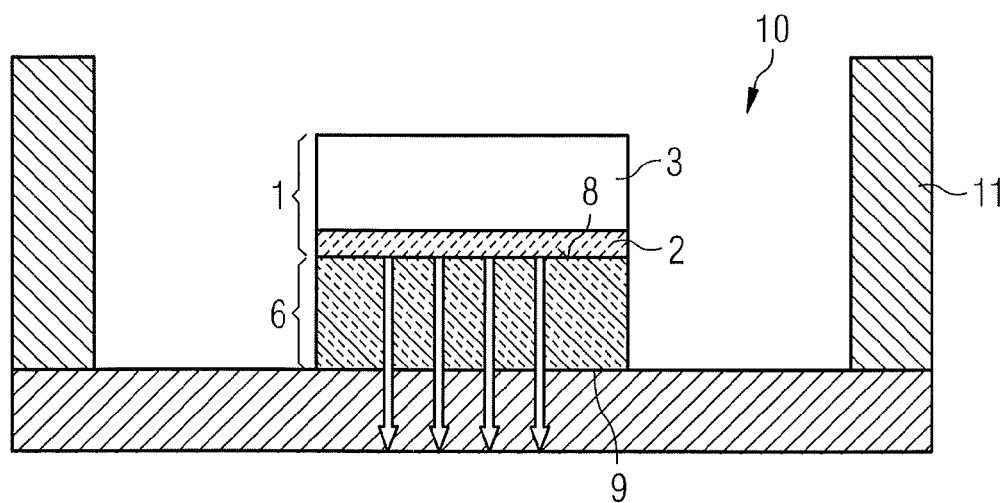
FIG. 6 shows a schematic sectional illustration of an example of a component comprising a semiconductor chip.

The optoelectronic component in accordance with the example in FIG. 6 comprises a semiconductor chip such as has already been described, for example, with reference to FIG. 5. In this case, the semiconductor chip is fixed by its rear side 9, situated opposite the radiation exit area 8 of the semiconductor body 6, in the cutout 10 of a component housing 11. In this case, the component housing 11 serves as a heat sink that dissipates heat from the semiconductor chip, as indicated by the arrows.

Figure 7:
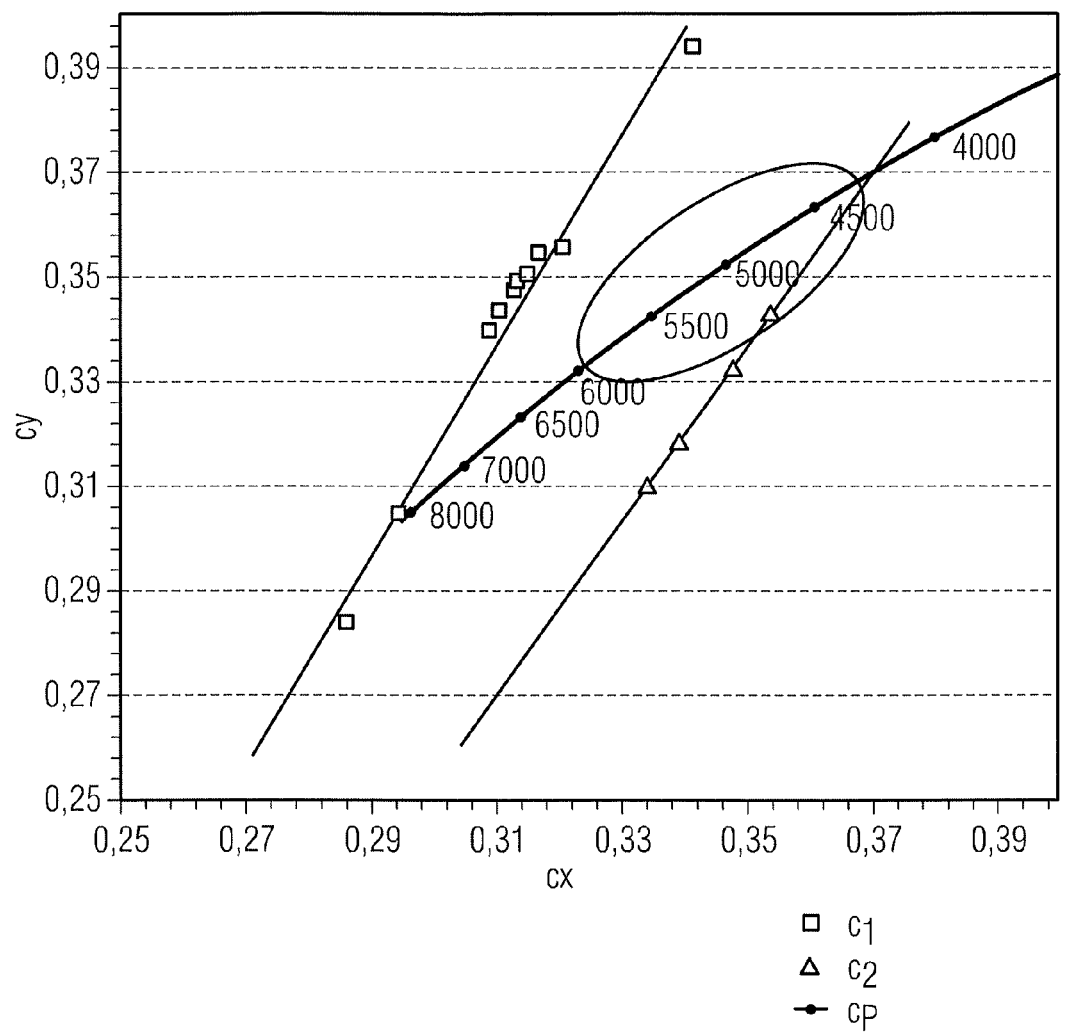
FIG. 7 shows measured values of the color loci cx and cy for various ceramic conversion elements as a function of the activator concentration.

FIG. 7 shows an excerpt from the CIE standard chromaticity diagram spanned by the color locus coordinates cx and cy and comprises the Planck curve $C_p$ between color loci having a color temperature of 8000 K to 4000 K. Furthermore, measured values of the color loci of semiconductor chips such as have already been described, for example, with reference to FIG. 5 are plotted in the excerpt.

In this case, the curve $C_1$ (open squares) shows the values for semiconductor chips comprising ceramic converter elements 1 having an active layer 2 formed from a ceramic YAG:Ce material having a low activator concentration of not greater than 0.5%. The ceramic converter element 1 in combination with a blue-emitting semiconductor body generates white light and is formed from active wavelength-converting material YAG:Ce over its entire thickness. The color loci predominantly lie above the Planck curve in the cold-white region of the CIE standard chromaticity diagram. The measured values of semiconductor chips comprising a ceramic conversion element 1 comprising, by contrast, highly doped YAG:Ce having an activator concentration of at least 2% for the ceramic active layer 2 ($C_2$, open triangles) lie below the Planck curve. The higher activator concentrations are required to achieve the color temperature of 4000 K to 6000 K.

Figure 8:
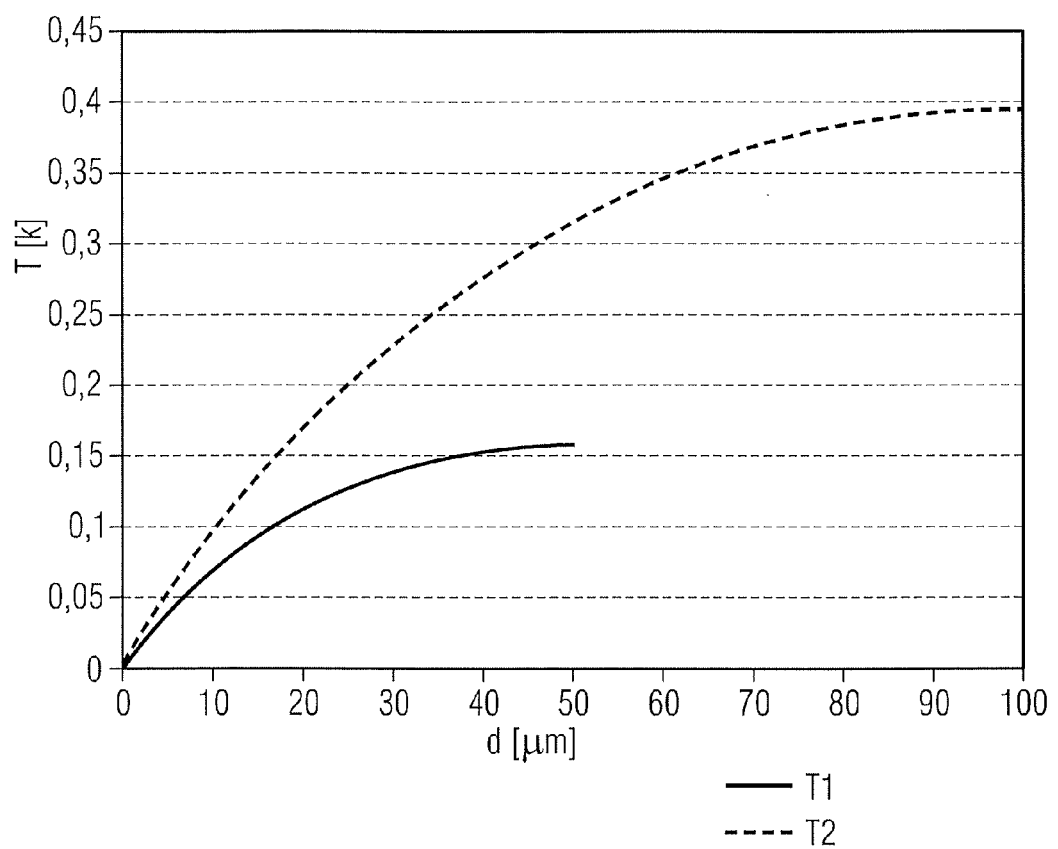
FIG. 8 shows simulated values of the temperature profile within a ceramic conversion element comprising an active layer and a ceramic layer and within a conventional ceramic conversion element.

FIG. 8 shows the profile of the temperature T in the active ceramic layer 2 of a conversion element 1 as a function of the thickness d. In this case, the curve $T_1$ (solid) shows the temperature profile of our layered conversion element 1, while the dashed line $T_2$ represents the temperature profile as a function of the thickness d of a conventional ceramic conversion element in block form. In this case, it can be seen that the temperature within the layered conversion element 1 is lower, in particular the maximum temperature thereof. This advantageously leads to lower optical losses at high power densities.

Figure 9A:
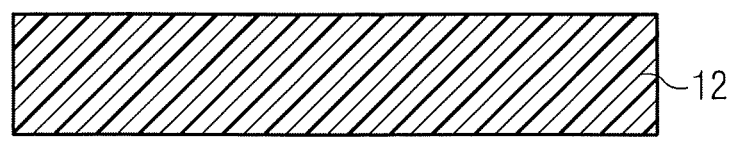
FIGS. 9A to 9C show schematic sectional illustrations of an example of a ceramic conversion element in three different method stages.
Figure 9B:
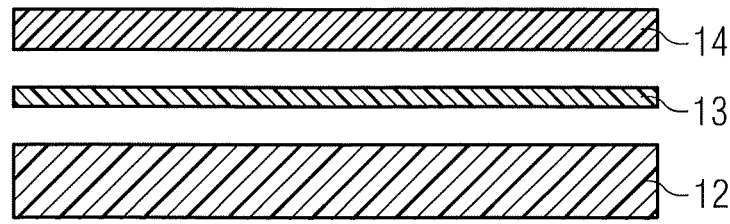
Figure 9C:
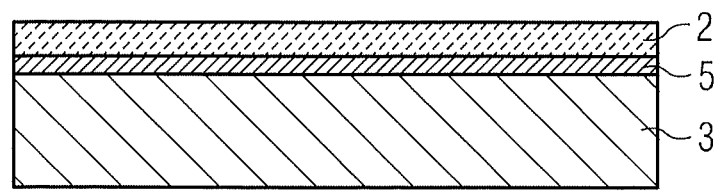

A method of producing a layered ceramic conversion element 1 is explained in greater detail by way of example with reference to FIGS. 9A to 9C.

A first method step involves providing a green sheet 12 as a basis for a ceramic carrier layer 3 (FIG. 9A). A green sheet is generally cast from the respective ceramic powder, a binder and additives on to a carrier film. To achieve a ceramic carrier layer 3 of arbitrary thickness, in this case a plurality of green sheets 12 as a basis for the carrier layer 3 can be stacked and laminated one above another. During lamination, the green sheets 12 are joined to one another by pressure and temperature.

As an alternative to a green sheet 12 as a basis for a ceramic carrier layer 3, a carrier layer 3 itself can also be made available.

In the example in FIGS. 9A to 9C, a next step involves providing a further green sheet 13 as a basis for an inhibitor layer 5 and arranging it on the green sheet 12 for the carrier layer 3. As an alternative thereto, the green sheet 12 as a basis for the carrier layer 3 can also be provided by applying a powder dispersion as a basis for a ceramic inhibitor layer 5.

Furthermore, a green sheet 14 as a basis for an active ceramic layer 2 is arranged on to the green sheet 13 as a basis for the inhibitor layer 5. As an alternative thereto, a basis for an active ceramic layer 2 can also be produced by applying a powder dispersion.

In a next step, the different green sheets 12, 13, 14 are joined to one another by a sintering method and converted into a layered ceramic composite assembly comprising a ceramic carrier layer 3, an active ceramic layer 2 and a ceramic inhibitor layer 5, as illustrated schematically in FIG. 9C.

The diffusion of activator ions from the active ceramic layer 2 into the carrier layer 3 can advantageously be reduced by an accelerated sintering process, particularly if no inhibitor layer 5 is provided.

Our elements, chips and methods are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:
1. A ceramic conversion element comprising:
  an active ceramic layer that converts electromagnetic radiation in a first wavelength range into electromagnetic radiation in a second wavelength range, which is different from the first wavelength range,
  a carrier layer transmissive to radiation in the first wavelength range and/or radiation in the second wavelength range, and
  an inhibitor layer having a thickness which is not greater than 5 µm arranged between the active layer and the carrier layer, said inhibitor layer reducing diffusion of activator ions from the active layer into the carrier layer, wherein
  the active layer, the carrier layer and the inhibitor layer are formed from a ceramic material.

2. The ceramic conversion element according to claim 1, which comprises a single active layer and a single carrier layer.

3. The ceramic conversion element according to claim 1, wherein the active ceramic layer comprises a phosphor selected from the group consisting of garnets doped with rare earth metals, alkaline earth metal sulfides doped with rare earth metals, thiogallates doped with rare earth metals, aluminates doped with rare earth metals, silicates doped with rare earth metals, orthosilicates doped with rare earth metals, chlorosilicates doped with rare earth metals, alkaline earth metal silicon nitrides doped with rare earth metals, oxynitrides doped with rare earth metals and aluminum oxynitrides doped with rare earth metals, silicon nitrides doped with rare earth metals and sialons.

4. The ceramic conversion element according to claim 1, wherein the active layer has a thickness which is less than or equal to 100 μm.

5. The ceramic conversion element according to claim 1, wherein the ceramic active layer is formed from a phosphor with an activator, the concentration of which has a value of 2% to 5%.

6. The ceramic conversion element according to claim 1, which has a thickness of 200 μm to 50 μm.

7. The ceramic converter element according to claim 1, wherein
the carrier layer has scattering centers formed from ceramic particles, the material of the ceramic particles is different from the ceramic material of the carrier layer, and
the scattering centers scatter electromagnetic radiation in the first wavelength range and/or electromagnetic radiation in the second wavelength range.

8. The ceramic converter element according to claim 1, wherein the carrier layer comprises pigments.

9. A radiation-emitting semiconductor chip comprising:
a semiconductor body that emits electromagnetic radiation in a first wavelength range from a radiation exit area, and
a ceramic conversion element according to claim 1, comprising an active ceramic layer that converts radiation in the first wavelength range into radiation in a second wavelength range, which is different from the first wavelength range.

10. The radiation-emitting semiconductor chip according to claim 9, wherein the active layer of the conversion element is applied in direct contact on to the radiation exit area of the semiconductor body.

11. The radiation-emitting semiconductor chip according to claim 9, which emits mixed-colored white light having a color temperature of 4000 K to 6000 K.

12. A method of producing a ceramic conversion element according to claim 1, comprising:
providing a carrier layer or a green sheet as a basis for a carrier layer,
applying a green sheet as a basis for an active ceramic layer or applying a powder dispersion as a basis for the active ceramic layer on to the carrier layer or on to the green sheet serving as a basis for the carrier layer, and
sintering the layer composite assembly.

* * * * *